US006102528A

United States Patent [19]

Burke et al.

[11] Patent Number: 6,102,528

[45] Date of Patent: Aug. 15, 2000

[54] DRIVE TRANSISTOR FOR AN INK JET PRINTHEAD

[75] Inventors: Cathie J. Burke, Rochester; Biay-Cheng Hseih, Pittsford; William G. Hawkins, Webster, all of N.Y.

[73] Assignee: Xerox Corporation, Stamford, Conn.

[21] Appl. No.: 08/953,656

[22] Filed: Oct. 17, 1997

[51] Int. Cl.[7] ................................ B41J 2/05; H01L 29/76

[52] U.S. Cl. ................................ 347/59; 257/339

[58] Field of Search ................................ 347/57, 58, 59; 257/339, 345, 404, 402, 409

[56] References Cited

U.S. PATENT DOCUMENTS

| | | | |
|---|---|---|---|
| 4,308,549 | 12/1981 | Yeh | 357/23 |
| 4,947,192 | 8/1990 | Hawkins et al. | 346/140 |
| 5,010,355 | 4/1991 | Hawkins et al. | 346/140 |
| 5,159,353 | 10/1992 | Fasen et al. | 346/140 |
| 5,463,237 | 10/1995 | Funaki | 257/336 |
| 5,517,224 | 5/1996 | Kaizu et al. | 347/59 |
| 5,753,958 | 5/1998 | Burr et al. | 257/392 |
| 5,790,154 | 8/1998 | Mitani et al. | 347/59 |

FOREIGN PATENT DOCUMENTS

| | | |
|---|---|---|
| 0 494 076 A2 | 7/1992 | European Pat. Off. . |
| 0 717 448 A1 | 6/1996 | European Pat. Off. . |
| 0 736 898 A2 | 10/1996 | European Pat. Off. . |

OTHER PUBLICATIONS

Silicon Processing for the VLSI Era, Stanley Wolf, Ph.D., vol. 3, pp. 232–245, 1995.

*Primary Examiner*—John Barlow
*Assistant Examiner*—Michael S. Brooke
*Attorney, Agent, or Firm*—Robert A. Chittum

[57] ABSTRACT

A drive transistor for a high resolution ink jet printhead having a pocket implant in the gate region of the device. The pocket implant enables a reduced source to drain spacing without loss of breakdown voltage. Accordingly, the size of the transistor may be reduced. Alternatively, this device is suitable for addressing 1200 spi resolution printheads. In one embodiment, the pocket implant extends about 1 $\mu$m beyond the gate region towards the drain region. Both embodiments produce a graded drift region.

9 Claims, 4 Drawing Sheets

DRIVE TRANSISTOR FOR AN INK JET PRINTHEAD

BACKGROUND OF THE INVENTION

This invention relates to ink jet printing devices and more particularly to a drive transistor for a high resolution thermal ink jet printhead which is integrally formed on a silicon substrate of the printhead containing both the heating elements and printhead addressing circuitry means.

Thermal ink jet printing is accomplished by a droplet-on-demand type printer having a printhead with an array of nozzles from which droplets are selectively ejected. It was early recognized that it was not practical to use one lead for each droplet-ejecting heating element associated with each printhead nozzle. Therefore, active integration of electronic circuitry on the heating-element-containing substrate of a printhead to reduce lead count was implemented rapidly by the ink jet industry.

There is a continual demand for higher resolution printers, meaning more nozzles per inch, because adjacent printed spots are printed by separate nozzles. As the number of nozzles per inch increases well above 300 spots per inch (spi), it was found difficult, if not impractical, to layout compact MOSFET drive transistor switches that fit into the space available behind each heating element without increasing the size of the silicon substrate required. The MOSFET layout that produces the highest current carrying capability alternates transistor sources and drains in parallel arrays behind the heater elements. Depending on the resolution, one or more repeats of a drive transistor may reside behind the associated heater element. When the silicon area required for each printhead increases, the number of printheads which can be made from each silicon wafer decreases, thus driving up the manufacturing cost.

Unfortunately, as the nozzles are moved closer together, the heating elements are likewise moved closer together and the space available to separate drive transistor sources and drains decreases. When attempting to use the smaller space, so as not to increase the required silicon area, the distance from source to drain of the transistors is decreased, causing the depletion region associated with the positively biased drain to extend toward the source and create a subsurface conduction path even when the transistor is in the off state. When this phenomena occurs, the transistor's gate can no longer control conduction through the power MOSFET. This effect is commonly referred to as 'punch through' and must be avoided.

Prior art printheads using MOS circuitry are disclosed in U.S. Pat. No. 4,947,192; U.S. Pat. No. 5,010,355; and U.S. Pat. No. 5,159,353, and U.S. Pat. No. 4,308,549; discloses a high voltage field effect transistor.

U.S. Pat. No. 4,308,549 discloses a circular high voltage field effect transistor and process for making it. The transistor has a central drain and concentric annular field plate, gate, and source. Implantation and diffusion techniques are used to produce the source and channel regions. Device dimensions are varied to improve either current, voltage capability, or speed.

U.S. Pat. No. 4,947,192 discloses a printhead formed by monolithic integration of MOS transistor switches on the same silicon substrate containing the resistive heating elements. The transistor switches and heating elements are formed from a single layer of polysilicon with the heating elements formed on a thermally grown field oxide layer having a thickness ranging from about one to four microns.

U.S. Pat. No. 5,010,355 discloses a thermal ink jet printhead having multi-layered ionic passivation of the MOS electronic circuitry which is exposed to the ink. The multi-layered passivation consists of two or three thin film layers to protect the MOS circuitry from mobile ions in the ink. Typical monolithic silicon integrated MOS field effect transistors are described for selective addressing of the heating elements, and these type of monolithic devices are especially susceptible to mobile ions commonly found in inks used by thermal ink jet printers.

U.S. Pat. No. 5,159,353 discloses a thermal ink jet printhead having MOSFET drive transistors which are integrated into the printhead structure. The transistor uses a reduced number of manufacturing steps by utilizing the initial silicon dioxide layer and overlying silicon nitride layer on the silicon wafer, when patterned, as the gate oxide layer in the completed MOSFET transistor. The silicon nitride layer is first patterned for use as a mask to produce the field oxide regions, and then later etched to form the gate.

The present invention solves the problem of enabling high resolution printheads to use reduced silicon substrate areas for the transistors without reducing the high breakdown voltages or requiring that the addressing circuitry be changed.

SUMMARY OF THE INVENTION

It is an object of the present invention to provide an improved drive transistor having reduced drain to source spacing without loss of breakdown voltage and without punch through effect. This reduced source to drain spacing enables production of printheads with resolutions up to 1200 spi.

In one aspect of the invention, there is provided a drive transistor for heating elements of a high resolution thermal ink jet printhead which is integrally formed on p-type silicon within a printhead containing both the heating elements and printhead addressing circuitry means, comprising: an elongated drain region being connected to a respective heating element; source regions being located on opposing sides of the drain region, the source regions being parallel to the drain region and connected to ground; elongated gate regions having a parallel longer portion which is parallel to the source and drain regions and located therebetween, the gate region being connected to the printhead addressing circuitry from which electrical signals are selectively applied to the gate region, thereby activating the transistor and enabling the application of a current pulse to a selected heating element for the ejection of an ink droplet from the printhead; a gate oxide layer between the gate electrode and the substrate channel region; the drain region having a lightly doped $n^-$ type drift region extension and an $n^+$ ion implanted region in the drain region for electrode contact; the source region having an $n^+$ ion implanted region in the substrate and a p-type pocket implant that extends beneath the gate oxide layer and the surface channel region, the pocket implant enabling shorter source, drain, and gate regions without loss of breakdown voltage while concurrently preventing punch through, so that a suitable integral drive transistor may be provided for high resolution printheads without increasing the required substrate area therefor. Although the lightly doped drain extension is technically part of the drain, it will be referred to as the drift region, and the heavily doped part of the drain will be referred to as the drain, to clarify the inventive features of this invention.

In another embodiment, the p-type pocket implant is not only beneath the gate oxide layer and the channel region, but extends beyond the channel region to also reside in the drift region for a predetermined distance, which in one embodiment is about 1 $\mu$m.

BRIEF DESCRIPTION OF THE DRAWINGS

The present invention will now be described by way of example with reference to the accompanying drawings, wherein like reference numerals refer to like elements, and in which.

DESCRIPTION OF THE PREFERRED EMBODIMENT

Figure 1:
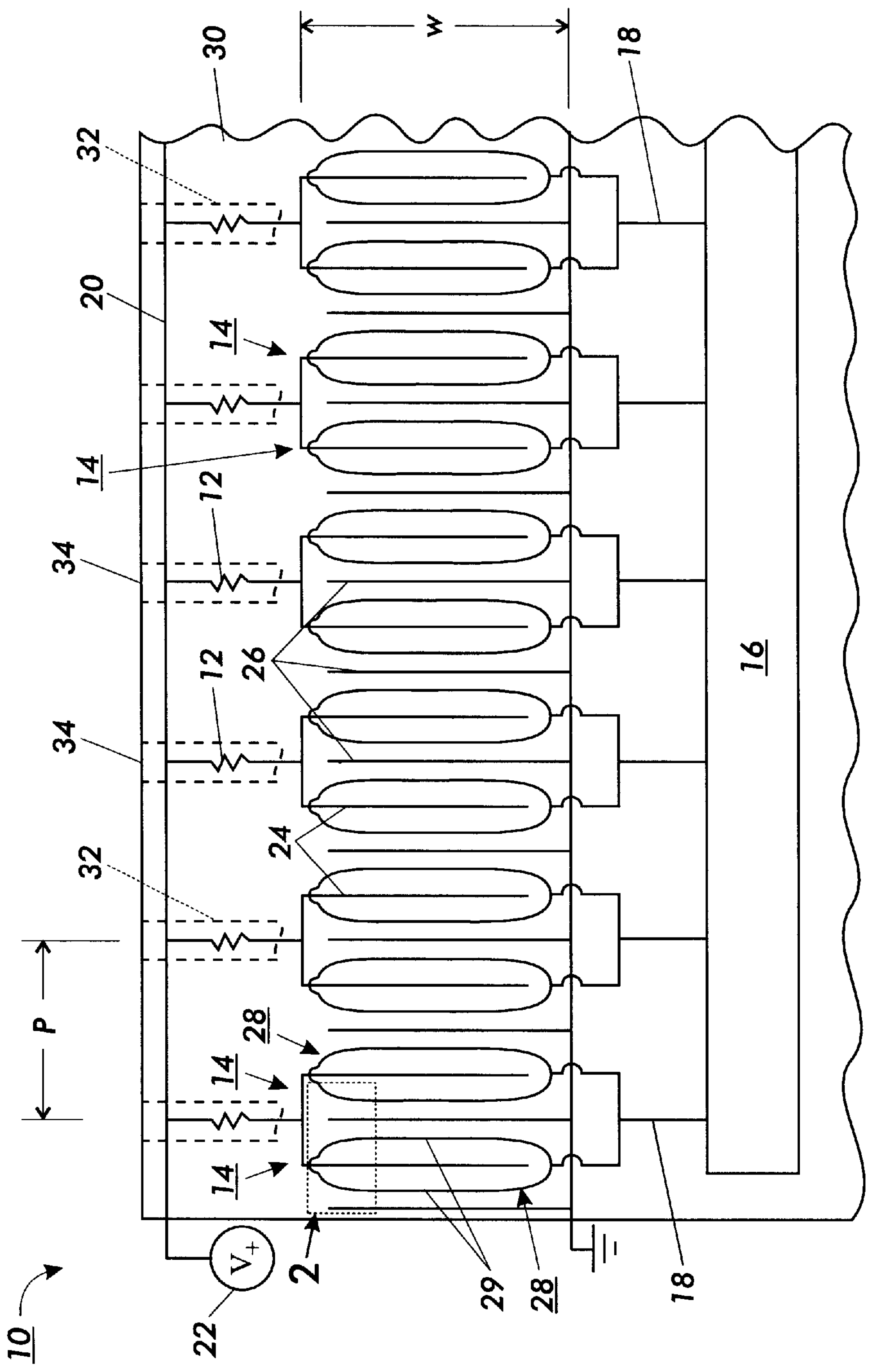
FIG. 1 is a partially shown plan view of an electrical diagram for a thermal ink jet printhead having the transistors of the present invention.

In FIG. 1, a partially shown plan view of an electrical schematic diagram of the monolithically integrated circuitry 10 of a thermal ink jet printhead (not shown) is shown comprising heating elements 12, switching drive transistor 14, addressing circuitry means 16, interconnecting leads 18, and common supply lead 20. For a typical printhead in which the present inventive drive transistor may be used, refer to U.S. Pat. No. 4,947,192 and U.S. Pat. No. 5,010,355 both of which patents are incorporated herein by reference. The heating elements 12, such as described in these two incorporated patents, are located on a dielectric layer formed on a silicon substrate 30 of a printhead (not shown) in capillarily filled ink channels 32 (partially shown in dashed line) a predetermined distance upstream from the channel open ends 34 which serve as the droplet ejecting nozzles. The predetermined distance is about 50 to 300 $\mu$m. The common supply lead 20 is formed on the silicon substrate in the region between the nozzles and the driver transistors and connected to multiple heating elements. A voltage of 20 to 60 volts from voltage source 22 is applied to the common supply lead. At 400 nozzles per inch or more, meaning a printing resolution of 400 spots per inch (spi) or more, the transistor configuration of the present invention enables the placement of two such transistors 14 side-by-side with their respective drain and drift regions 24 connected in parallel and then connected to a respective one of the heating elements. Parallel source regions 26 are formed on opposite sides of each drain and drift region, so that there are three sources for each pair of drains, all mutually parallel to each other and the drain regions. The source regions are connected to ground. The transistor gates 28 are each an elongated oval-shaped region having two parallel longer portions 29 which are parallel to the source and drain regions and located therebetween. The gate regions are connected to the printhead addressing circuitry 16. In this embodiment, the addressing means is monolithically integrated on the silicon substrate 30 with the drive transistors and heating elements. Alternatively, a number of other addressing means such as matrix addressing can be used to activate the MOSFET switches. Electrical signals from the addressing circuitry are selectively applied to the gate regions to activate the associated pair of transistors and enable the application of a current pulse to the selected heating element for the ejection of an ink droplet from the printhead nozzle.

The two side-by-side transistors, when connected in parallel instead of a single wider transistor (i.e., the dimension W is larger), enables substantial chip size reduction. As the printing resolution increases, the number of nozzles per inch increases and, if the drive transistors cannot be formed in the space substantially equal to the width of the open channel ends (nozzles), plus a portion of the distance between nozzles, then the transistors must be fanned out behind the heaters and thereby increase the area consumed by the switches and their associated interconnection runs. Minimum spacing dimensions are required by the prior art drive transistors for the drain, drift, source, and gate regions to provide a device with the necessary breakdown voltage and prevent punch through. As the number of nozzles per inch increase to 400 or more, the present transistor configurations cannot be doubled and fit within the space available for each of the heating elements associated with the nozzle.

Using existing drive transistor design criteria, the total minimum dimension for each double transistor to drive the heating elements of a 400 spi printhead, each having the required breakdown voltage of >60 volts without punch through is at least 64 $\mu$m, while the available space is 63.5 $\mu$m. Such a prior art drive transistor has source of 7 $\mu$m, gate length of 4 $\mu$m, drift length of 3 $\mu$m, and drain metal of 8 $\mu$m, with a 0.5 $\mu$m distance between the drain metal and the drift end. Accordingly, for high resolution printheads having 400 spi or more printing capability, only single prior art transistors can be used, thus requiring almost double the width dimension "W" between the heating element and addressing circuitry to accommodate the single transistor. The increase in die size significantly reduces the number of printhead die that fit on a silicon wafer, so the cost per printhead increases. As described below, a modified transistor design having a resist masked boron implant extending below the channel surface region enables a reduced size for a suitable drive transistor, so that two side-by-side transistors may be used to address the heating elements, and thus shorten the dimension W. This same design enables a single transistor switch to be positioned behind 800 spi resolution heaters. By modifying the fabrication process to allow reduction in via size design rules, this design enables layout of driver transistors at a 1200 spi pitch. The prior art transistors can not be laid out at 1200 spi pitch, even if the via size is reduced.

Figure 2:
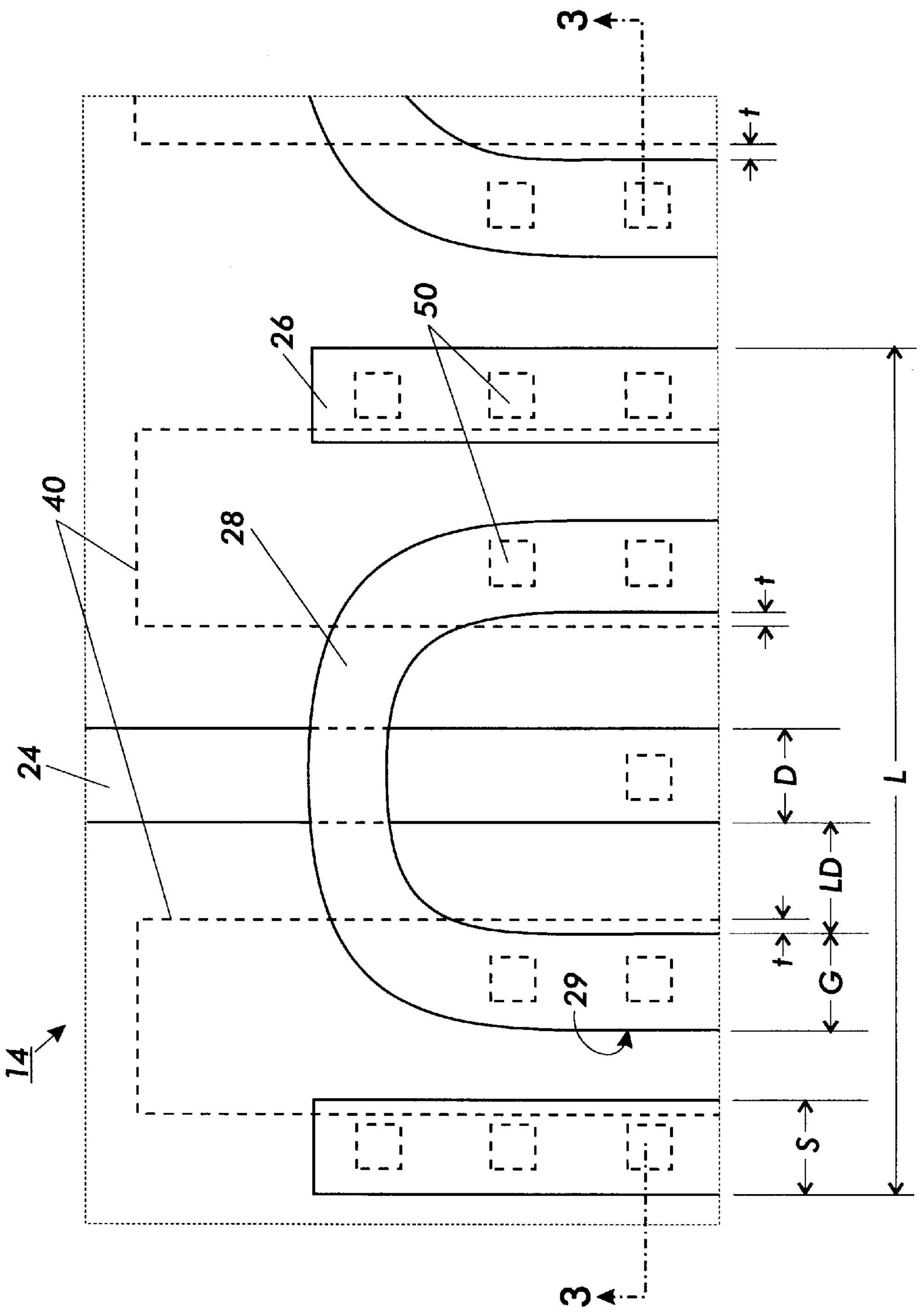
FIG. 2 is an enlarged view of a portion of the transistor which is enclosed in FIG. 1 by dashed rectangle 2.
Figure 3:
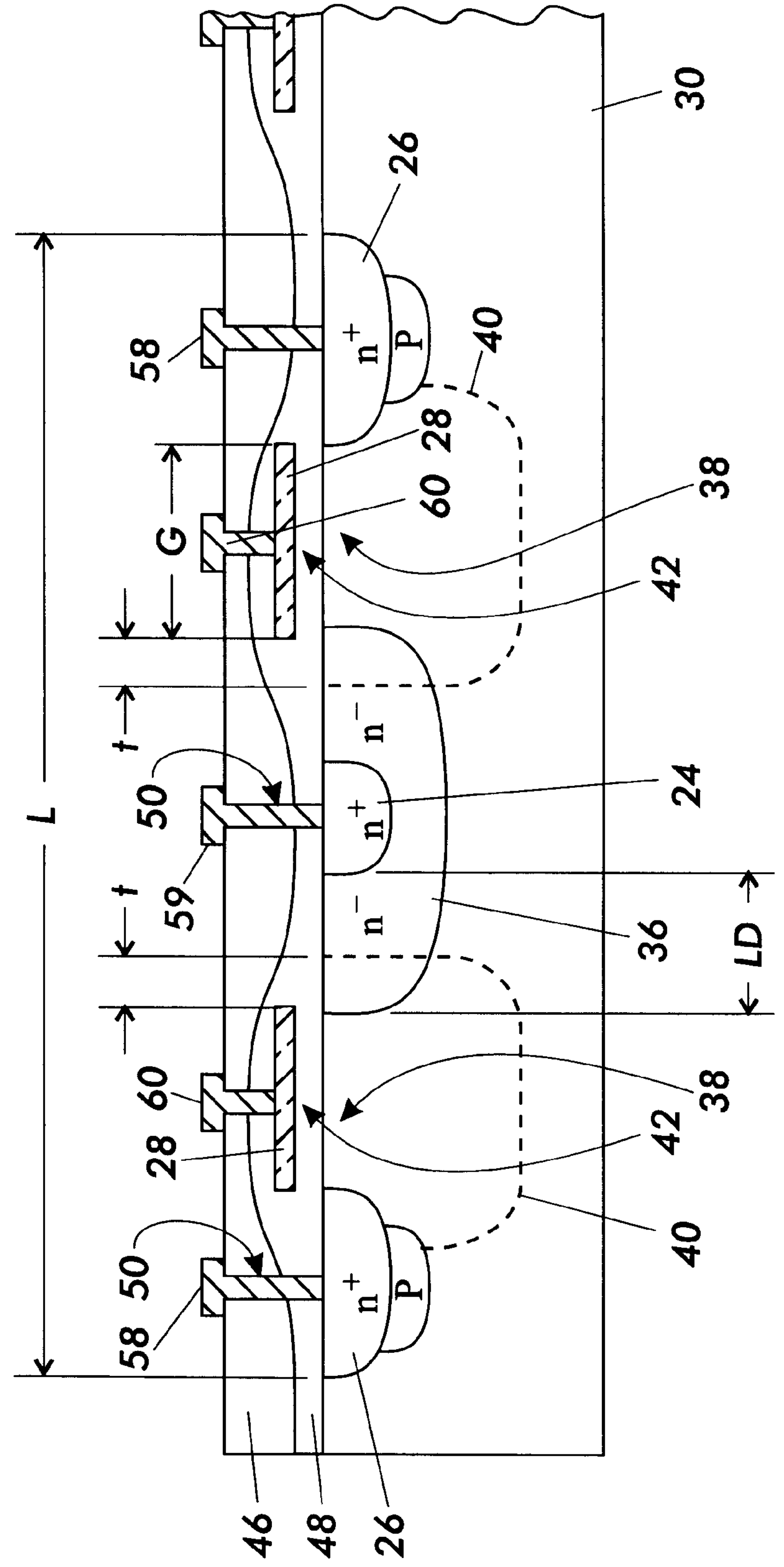
FIG. 3 is a cross-sectional view of the transistor shown in FIG. 2 as viewed along view line 3—3 thereof.

FIG. 2 is an enlarged view of a portion of the transistor 14 shown in FIG. 1 which is identified therein by an enclosed area "2." FIG. 3 is a cross-sectional view of the transistor 14 as viewed along view line 3—3 in FIG. 2. Referring to FIGS. 2 and 3, the process for fabricating will be described, which is similar to that described in U.S. Pat. No. 4,947,192, but modified to add one extra mask level or process step, so that there is a doped region extending from the channel region into the substrate and this region is more heavily doped than the substrate, and optionally, a drift region that has a low sheet resistance near the drain region and a higher sheet resistance near the gate region. This doped region will subsequently be referred to as a pocket implant. The phrase "pocket implant" will be understood to mean the more heavily p-type doped region which results from the implanted boron dose and subsequent thermal drive in. The resultant optional drift region is referred to as a "graded" drift region, and, with the doped region extending from the channel, enables an optimized minimum transistor source to drain spacing with increased breakdown voltage without punch through.

It is important to contrast the pocket implant feature of lateral power MOSFET's with a superficially similar but distinct structure which is present in submicron CMOS technology. In small design rule CMOS technology, two separate implants are utilized in n channel devices, one to control surface conduction and a second to suppress punch through. The threshold adjustment implant is placed at the surface of the channel and also a deeper punch through implant is positioned below the channel surface and does not overlap the threshold implant.

For power MOSFET technology, the pocket implant is carried out at a different point in the process sequence, has a different relationship to the threshold adjustment implant, and also serves a distinctly different function. First, the punch through implant extends from source to drain. The pocket implant does not extend to the drain of the device. If the pocket implant doping is extended to the drain, then the junction between the drain and the substrate would break down at a lower voltage. By keeping the pocket implant away from the drain, the high breakdown voltage between the lightly doped substrate and degenerately doped drain region is retained. Secondly, modern implantation equipment is not capable of operating routinely above about 200 kilovolts acceleration voltage. This places the maximum depth for a boron implant dose about ½ $\mu$m below the surface. It is important that the pocket implant extends to a depth comparable with the depletion layer thickness around the drain region. The increased depth is required because punch through effect takes place in this deep subsurface region. For a device biased at 40 to 50 V, this depth is about 2 $\mu$m. It is not practical to implant to this depth with production implantation equipment. As a consequence, the pocket implant is implanted early in the fabrication process (either just before or just after field oxidation) and then driven to a depth of about 2 $\mu$m by the subsequent thermal cycles employed in wafer fabrication. Because the pocket implant is diffused a distance substantially greater than the projected range of the implanted species, the threshold implant also overlaps with the pocket implant to produce a threshold voltage in the final power MOSFET which is higher than the voltage of logic transistors in the same circuit. Finally, the pocket implant, owing to the extended lateral diffusion which takes place, can be used to counter dope the drift region, and this in turn, allows a graded drift region to be formed simultaneously with the punch through protection formed by the pocket implant.

A plurality of printhead silicon substrates with monolithic integrated heating elements, drive transistors and printhead addressing circuitry means are formed by processing a p-type silicon wafer. Since this invention relates to the drive transistor, the heating elements and addressing circuitry means will not be discussed, though some components thereof may be processed concurrently with the transistor. Using a well known process similar to that disclosed in U.S. Pat. No. 4,947,192 and incorporated herein by reference, the transistors are formed with only one additional process step. According to the known or standard process, a thin silicon dioxide ($SiO_2$) layer is formed on the wafer, followed by the deposition of a silicon nitride ($Si_3N_4$) layer to form a LOCOS mask. A patterned photoresist layer is used to pattern the $Si_3N_4$ layer for a boron implanted channel stop (not shown) and block the channel stop boron implant from the transistor active areas. After the first $Si_3N_4$ layer is removed, a field oxide layer is thermally grown over the channel stops to a thickness of about 1 $\mu$m, and the new process step of the present invention is implemented; viz., a photoresist layer is deposited and patterned for a pocket boron implant 40 (shown in dashed line) in the channel region 38, and optionally beyond the gate region 28 towards the drain region 24 for the distance "t" of about 1 $\mu$m. The pocket implant dose is about $1\text{–}4\times10^{12}$ boron ions per $cm^2$ at 180 keV. After the subsequent high temperature cycles during wafer processing, the pocket implant has a concentration of about $2\times10^{16}$ ions/$cm^3$ and has diffused to a depth of about 1.8 $\mu$m. To prevent punch through, the pocket dopant must extend as deep as the depth of the depletion region edge beneath the drift region, when the transistor switch is turned on under operating conditions for driving the heater elements. For the high voltage MOSFET switches described in this invention, the pocket implant must be driven into the silicon to a depth of about 2 $\mu$m. This depth requires extended diffusion at high temperature. Alternatively to the process described above, the field oxidation step is used to concurrently drive the boron into the wafer. Alternative process sequences could separate the pocket implant drive in from the field oxidation step.

The $SiO_2$ layer in the active region of the transistor (i.e., the gate, source, and drain regions) is removed to expose the bare silicon surface, thresholds are set, and a gate oxide layer 42 is grown, followed by the deposition of a single polysilicon layer which is patterned to form the transistor gate regions 28 on the gate oxide layer 42, as well as the heating elements 12, shown only in FIG. 1. The wafer is exposed to a drift implant of $1.5\times10^{12}$ phosphorous ions per square centimeter. Photoresist and the polysilicon gates are used to mask the channel region during the $n^+$ ion implantation of the source and drain regions. The wafer is then cleaned and re-oxidized to form a silicon dioxide layer 48 over the wafer including the gate regions. A phosphorous doped glass layer or a boron and phosphorus doped glass layer is then deposited on the thermally grown silicon dioxide layer and is reflowed at high temperatures to planarize the surface. Photoresist is applied and patterned to form vias 50 to the source and drain regions and aluminum metallization is applied to form the interconnections, thus providing contacts to the source, drain, and gate regions.

It is important to provide a drive transistor for a thermal ink jet printhead having a relatively high breakdown voltage ($V_{BR}$) of about 65 to 80 volts, because of the high voltage necessary to pulse the heating elements and thereby substantially instantaneously vaporize the ink in contact therewith. Typically the potential applied to a heating element is about 42 volts. The gate length (G) dimension in $\mu$m and the drift length (LD) in $\mu$m was varied between 3 and 5 $\mu$m and the breakdown voltage was measured for the typical transistor design and for a transistor of the present invention which has a pocket implant to provide a p-type region underneath the channel and a graded drift region. As seen in the tables below, the transistor length L may be reduced while maintaining a breakdown voltage of about 80 volts. Significantly, the reduced size of the transistor of the present invention also prevented punch through. For very high resolution printheads, no other drive transistor configuration could be used without requiring a silicon substrate larger than that necessary for the nozzles, or adding processing steps. The space required for the drive transistors is roughly the center-to-center distance between nozzles. Therefore, a 300 spi printhead has 84.7 $\mu$m center-to-center nozzle spacing and this is about the length available for the drive transistor. Using the same rationale, 400 spi provides a transistor pitch P of 63.5 $\mu$m (see FIG. 1), 600 spi provides 42.3 $\mu$m, 800 spi provides 31.75 $\mu$m, and 1200 spi provides 21.17 $\mu$m. The transistor pitch P is approximately the center-to-center spacing of the heating elements which is about 1/400 inch for a 400 spi printhead. For 400 spi printheads, transistor pairs having width W (see FIG. 1), and using the pocket implant of the present invention can be used to control a heating element, while a typical drive transistor pair configuration that achieves the breakdown requirement will not fit in the allotted space of 63.5 μm (1/400 inches). Consequently, a single transistor must be used and W (see FIG. 1), will increase substantially.

| PRIOR ART DRIVE TRANSISTOR | | | | DRIVE TRANSISTOR WITH POCKET IMPLANT | | | |
|---|---|---|---|---|---|---|---|
| Gate length (G) μm | Drift length (LD) μm | $R_{on}$ (Ω) | $V_{BR}$ (V) | Gate length (G) μm | Drift length (LD) μm | $R_{on}$ (Ω) | $V_{BR}$ (V) |
| 5 | 5 | 21.7 | 98.8 | 5 | 5 | 22.8 | 105.0 |
| 5 | 4.5 | 20.6 | 90.4 | 5 | 4.5 | 22.1 | 99.2 |
| 5 | 4 | 19.8 | 83.0 | 5 | 4 | 21.6 | 91.1 |
| 5 | 3.5 | 18.9 | 75.9 | 5 | 3.5 | 20.7 | 83.8 |
| 5 | 3 | 18.0 | 65.4 | 5 | 3 | 19.8 | 67.6 |
| 4.5 | 4.5 | 19.5 | 86.3 | 4.5 | 4.5 | 21.3 | 92.1 |
| 4.5 | 4 | 19.1 | 78.0 | 4.5 | 4 | 20.5 | 84.2 |
| 4.5 | 3.5 | 17.5 | 72.1 | 4.5 | 3.5 | 19.8 | 74.4 |
| 4.5 | 3 | 16.5 | 65.9 | 4.5 | 3 | 19.0 | 67.5 |
| 4 | 4 | 17.2 | 75.1 | 4 | 4 | 19.5 | 89.2 |
| 4 | 3.5 | 16.2 | 71.2 | 4 | 3.5 | 18.6 | 82.2 |
| 4 | 3 | 15.4 | 64.5 | 4 | 3 | 17.9 | 68.1 |
| 3.5 | 3.5 | 15.2 | 45.2 | 3.5 | 3.5 | 17.5 | 81.3 |
| 3.5 | 3 | 14.3 | 42.9 | 3.5 | 3 | 17.1 | 68.0 |
| 3 | 3 | 13.2 | 22.4 | 3 | 3 | 15.7 | 67.5 |

From the above table, a transistor with a pocket implant below the channel region of the present invention having a 3 μm gate length and a drift length of 3 μm has a breakdown voltage ($V_{BD}$) of greater than 65 volts. The typical drive transistor meeting these minimum requirements has a gate length of 4 μm and a drift length of 3 μm. Because the gate is oval and the transistors are used in pairs to minimize silicon real estate (see FIG. 1), the center-to-center spacing of a drive transistor pair of the typical drive transistor is 4 μm larger than that with the pocket implant. This 4 μm increase requires that the driver pairs fan out from the heating elements, resulting in a printhead die that is wider by 4 μm multiplied by the number of heating elements or nozzles. For example, a 256 nozzle array is increased in length by 1024 μm. Alternatively, a single driver transistor could be used, as mentioned in the example above, but a single driver transistor will increase the driver width W (FIG. 1), by about a factor of two. Neither of these alternatives for transistor drivers without pocket implants is desirable, because increasing the printhead die size reduces the number of die per wafer. At 800 spi, a single pocket implant device can be used to drive a single heating element. A suitable typical driver transistor will not fit at that pitch P, thereby requiring an increase in the length of the die because of the required spreading or fanning out of the driver transistors beyond the nozzle or heating element pitch.

It is well known that when the transistor is turned on by applying a suitable voltage to the gate, the sheet resistance of the drift layer or region limits the transconductance of the transistor, and therefore determines its size. It is desirable to reduce the drift region sheet resistance, but as the drift region sheet resistance is reduced, the electric field increases and reduces the breakdown voltage. When the electric field in the drift region becomes large, avalanche multiplication occurs in the drift region and the transistor fails.

The typical or common process for a transistor provides a uniformly doped drift region. It is, of course, highly desirable to have a drift region sheet resistance which is low near the drain region and higher near the gate region because a graded n− drift region produces an electric field which is more evenly distributed. The evenly distributed electric field results in the voltage being more uniformly dropped across the entire length of the drift region. If graded doping is used, the drift region can be made less resistive or shorter. However, such a graded doping is difficult to manufacture because multiple masking and implant steps are required.

As indicated above, the present invention incorporates a resist masked boron implant into the channel region 38, the source regions 26, and optionally extending into the drift region 38 for a distance of about 1 μm from the overlying gate region 28. The boron implant takes place through the LOCOS (active area) mask prior to field oxidation. During field oxidation, the boron implant diffuses into the silicon substrate 30 and diffuses laterally into the drift region. Accordingly, the sheet resistance of the drift region is graded, the boron under the channel surface region suppresses punch-through, and the channel region or overlying gate region which defines the channel region can be made shorter.

Referring to FIGS. 2 and 3, a preferred embodiment of the present invention is shown, where a pocket implant 40 having a concentration of 2 to $3\times10^{16}$ boron ions/$cm^3$ is depicted in dashed line. After diffusion of the pocket implant, it has a depth of 1.8 μm and, in one embodiment, extends beyond the gate region 28 for the distance "t" of about 1 μm. This places the pocket implant into the drift region and thus produces a graded drift region. The drift region length is indicated as "LD" and from the above table may be 3 μm for a device in which a $V_{BD}$ of 67.5 volts is adequate. The gate region length is indicated as "G" and may also be 3 μm. The overall length of the transistor is depicted as "L" and, to prevent an increase in silicon substrate size, must fit within the center-to-center distance of the nozzles (pitch) minus about 5 μm which is necessary to accommodate the feed through for the common lead 20. A typical length of the source and drain regions is about 7 or 8 μm, indicated by "S" and "D," respectively, and a typical overall length L also referred to a pitch, is about 29 μm. The width of the transistor is shown in FIG. 1 and is indicated by "W." The phosphorous doped silicon glass (PSG) 46 and silicon dioxide layer 48 is patterned to provide vias 50 therein for metal contact points 58, 59, 60 along the source, drain, and gate regions, respectively.

Figure 4:
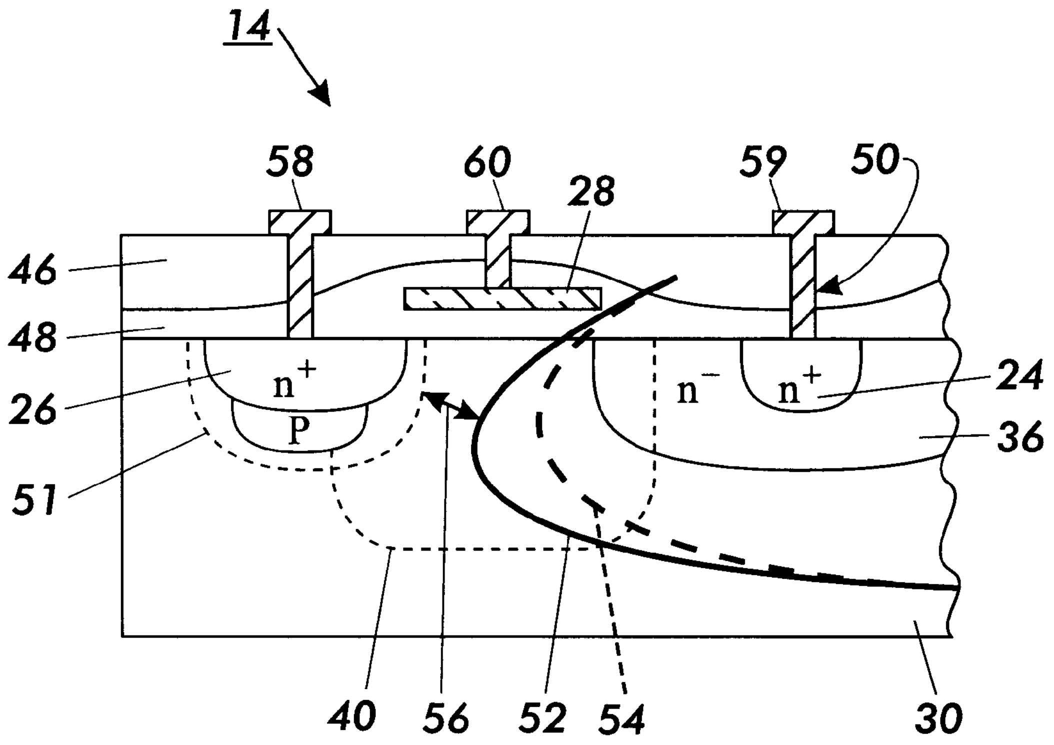
FIG. 4 is an enlarged view of a portion of the transistor shown in FIG. 3 diagramatically showing the drain depletion edge of the transistor of the present invention in contrast with a drain depletion edge of a prior art transistor.

Under a positive bias condition, the depletion width of the drift region 36, under the drain region 24, shown in FIG. 4, expands towards the source region 26 of the NMOS driver transistor 14. When the depletion edge 52, 54 approaches the source depletion 51, carrier multiplication occurs which creates a conduction path even when the transistor is in the off state. As mention earlier, this phenomenon is known as punch through. In FIG. 4, the drain depletion edge without the pocket implant 40 of the present invention is represented by the curve 52 and the drain depletion edge with the pocket implant is represented by the curve 54 shown in dashed line. Note that punch through, as illustrated by 56 for a given voltage, is impeded by the pocket implant underneath the channel surface, because the distance between the source region and drain depletion edge is increased when a pocket implant is present.

A drive transistor of the present invention has several advantages; viz., the gate and drift regions may be reduced, thus shortening the length of the transistor and enabling dimensionally smaller, high-resolution printheads of 400 spi or more; leaves the addressing means 16 unchanged because a wafer with an epitaxial layer is not required, increases the breakdown voltage, and prevents punch through. The driver design of the present invention can be used on any ink jet printhead and allows two drivers side-by-side rather than one for 400 spi printheads, thereby substantially reducing silicon substrate size of the printhead. This same design enables a single transistor switch to be positioned behind 800 spi resolution heaters. By modifying the fabrication process to allow reduction in via size design rules, this design enables layout of driver transistors at 1200 spi pitch.

At all resolutions, it allows bigger feed throughs, benefiting butted printhead subunits for large array printheads. While this invention is described for a sideshooter configuration, it is equally applicable to a roofshooter configuration as well.

Although the foregoing description illustrates the preferred embodiment, other variations are possible and all such variations as will be apparent to those skilled in the art are intended to be included within the scope of this invention as defined by the following claims.

We claim:

1. A drive transistor for switching heating elements of a thermal ink jet printhead which is formed on a p-type silicon substrate contained in a printhead comprising:

an elongated drain region being connected to a respective heating element;

source regions spaced from the drain region, the source regions being connected to ground;

an elongated, oval-shaped gate region having elongated, parallel portions;

channel regions formed under the elongated, parallel portions of the gate region, which are adjacent to the source and drain region and located therebetween, the gate region being connected to a printhead addressing means from which electrical signals are selectively applied to the gate region, thereby activating the transistor and enabling the application of a current pulse to a selected heating element for the ejection of an ink droplet from the printhead;

the drain region having a lightly doped $n^-$ type drift region offset from an $n^+$ ion implanted contact region;

each source region being comprised of an $n^+$ ion implanted region; and a p-type pocket implant underneath the entire channel region of each gate region and at least extending from the channel region into the substrate to an adjacent source region and into the drift region for about 1 $\mu$m, whereby a shorter source region to drain region spacing is provided without loss of breakdown voltage, and a suitable drive transistor may be provided for high resolution printheads.

2. The drive transistor as claimed in claim 1, wherein the pocket implant extends laterally beyond the edge of the drift region to overlap a part of said drift region, thereby producing a graded drift region; wherein the drift region has a first sheet resistance; and wherein said portion of the drift region overlapped by the pocket implant has a second sheet resistance higher than said first sheet resistance.

3. The drive transistor as claimed in claim 1, wherein the pocket implant is produced by doping with boron ions to concentration of above $1\times10^{16}$ ions/$cm^3$; and wherein the pocket implant extends to a depth of at least 1.0 $\mu$m.

4. The drive transistor as claimed in claim 3, wherein the gate region (G) has a length of 3 $\mu$m; wherein the drift length (LD) is 3 $\mu$m; and wherein the breakdown voltage ($V_{BD}$) is greater than 40 volts.

5. An improved high resolution thermal ink jet printhead having an array of heating elements on a dielectric layer formed on a silicon substrate and a channel plate bonded thereto containing a plurality of capillary filled ink channels interconnecting an array of nozzles with a reservoir, each channel having a nozzle and a heating element therein a predetermined distance from the nozzle, each of the heating elements being activated in response to signals from circuitry on the silicon substrate which includes switching driver transistors, the improvement comprising:

driver transistors each having an elongated drain region, with a lightly doped $n^-$ type drift region offset from an $n^+$ ion implanted contact region, connected to a respective heating element, grounded source regions located on opposing sides of the drain region, an elongated gate region between the source and drain regions, the gate region being connected to addressing means from which signals are selectively applied to the gate region, and a channel region in the silicon substrate beneath the gate region; and said drive transistor having a pocket implant beneath at least the entire gate region, wherein the p-type pocket implant extends into the drift region for about 1 $\mu$m.

6. The improved printhead as claimed in claim 5, wherein each heating element has two driver transistors with the drain regions connected in parallel; and wherein the source regions are parallel and on opposite sides of each drain region.

7. The improved printhead as claimed in claim 6, wherein the printhead has a nozzle-to-nozzle spacing of at least 400 per inch.

8. The improved printhead as claimed in claim 5, wherein the pocket implant is produced by doping with boron ions to concentration of about $2\times10^{16}$ ions/$cm^3$; and wherein the pocket implant extends to a depth of about 1.8 $\mu$m.

9. The improved printhead as claimed in claim 8, wherein the gate region (G) has a length of 3 $\mu$m; wherein the drift length (LD) is 3 $\mu$m; and wherein the breakdown voltage ($V_{BD}$) is greater than 65 volts.

* * * * *